United States Patent [19]
Lin et al.

[11] Patent Number: 5,883,011
[45] Date of Patent: Mar. 16, 1999

[54] METHOD OF REMOVING AN INORGANIC ANTIREFLECTIVE COATING FROM A SEMICONDUCTOR SUBSTRATE

[75] Inventors: Xi-Wei Lin, Fremont; Satyendra Sethi, Pleasanton; Henry Lee, San Francisco, all of Calif.

[73] Assignee: VLSI Technology, Inc., San Jose, Calif.

[21] Appl. No.: 878,451

[22] Filed: Jun. 18, 1997

[51] Int. Cl.$^6$ .................................................. H01L 21/00
[52] U.S. Cl. .......................... 438/747; 438/756; 216/40; 216/90
[58] Field of Search ..................... 438/739, 745, 438/747, 756; 216/40, 41, 90, 96, 97, 99

[56] References Cited

U.S. PATENT DOCUMENTS

| | | | |
|---|---|---|---|
| 4,420,365 | 12/1983 | Lehrer | 438/724 X |
| 4,606,931 | 8/1986 | Olsen et al. | 438/725 X |
| 5,126,289 | 6/1992 | Ziger | 438/720 X |
| 5,214,001 | 5/1993 | Ipposhi et al. | 438/693 X |

*Primary Examiner*—William Powell
*Attorney, Agent, or Firm*—Hickman & Martine, LLP

[57] ABSTRACT

A method of removing an inorganic antireflective coating from a semiconductor substrate and a method of forming an integrated circuit (IC) are provided. In the former method, a sacrificial layer is formed over a semiconductor substrate, the layer being selectively removable from the substrate and compatible with photolithography. An inorganic antireflective coating such as SiON is then formed over the sacrificial layer. Thereafter, the sacrificial layer is removed from the substrate to lift the coating off the substrate. Preferred materials for the sacrificial layer include TiN, tetraethyl orthosilicate-based silicon oxide, spin-on-glass (SOG) such as hydrogen silsesquioxane and methyl silsesquioxane, and porous polymeric materials. In the latter method, a patterned layer of photoresist material is formed over the anitreflective coating. The portions of the antireflective coating, the sacrificial layer, and the semiconductor substrate which are not covered by the patterned layer of photoresist material are then removed to define features of an IC. After the patterning of IC features, the sacrificial layer is removed from the IC features to lift the antireflective coating off such features. IC devices formed in accordance with these methods also are provided.

21 Claims, 5 Drawing Sheets

5,883,011

METHOD OF REMOVING AN INORGANIC ANTIREFLECTIVE COATING FROM A SEMICONDUCTOR SUBSTRATE

BACKGROUND OF THE INVENTION

The present invention relates generally to the fabrication of integrated circuits and, more particularly, to a method of removing an inorganic antireflective coating used in photolithography from a semiconductor substrate and to a method of forming features of an integrated circuit.

The trend in integrated circuit (IC) technology toward smaller feature sizes is approaching the use of features which are 0.25 μm and smaller. To photolithographically pattern such small features, the use of an antireflective coating (ARC) becomes necessary. This ARC helps in the definition of small images by reducing the light scattering from the substrate into the photoresist. The introduction of an ARC, however, may have several detrimental consequences. For example, an inorganic bottom antireflective coating (BARC), e.g., SiON, cannot be easily removed unless additional wet or dry etch processes are added to the IC process flow. These additional etch processes may lead to excessive oxide loss at the oxide spacer of a transistor or in the field isolation. In the event the BARC layer undergoes high temperature thermal cycles or oxidation, it becomes even more difficult to etch and, consequently, the degree of oxide loss becomes more severe.

One of the key elements of deep submicron technology is a salicide process in which a self-aligned polycide gate structure is formed. The polycide gate structure includes a layer of refractory metal silicide on the top surface of the polysilicon gate. To obtain uniform metal silicide, the top surface of the polysilicon gate must be clean. When an inorganic BARC layer is used in photolithography, it is likely that the etch processes required to obtain a sufficiently clean polysilicon surface will result in excessive oxide loss at the oxide spacer or in the field isolation, as mentioned above. Thus, the use of an inorganic BARC layer may be incompatible with current IC process flows.

In view of the foregoing, there is a need for a method which facilitates easy removal of an inorganic BARC layer from a semiconductor substrate. Such a method would allow an inorganic BARC layer to be incorporated into the process flow for an IC, thereby enabling the patterning of small features, e.g., 0.25 μm and smaller, without causing significant damage to neighboring areas of the IC.

SUMMARY OF THE INVENTION

Broadly speaking, the present invention fills this need by providing a sacrificial layer which enables an inorganic antireflective coating used in photolithography to be easily removed from a semiconductor substrate.

In accordance with one aspect of the present invention, a method of removing an inorganic antireflective coating from a semiconductor substrate is provided. In this method a sacrificial layer is formed over a semiconductor substrate, the layer being selectively removable from the substrate and compatible with photolithography. An inorganic antireflective coating is then formed over the sacrificial layer. After the patterning of IC features, the sacrificial layer is removed from the substrate to lift the coating off the substrate.

The sacrificial layer is preferably a material selected from the group consisting of TiN, tetraethyl orthosilicate-based (TEOS-based) silicon oxide, spin-on-glass (SOG) such as hydrogen silsesquioxane and methyl silsesquioxane, and porous polymeric materials. The inorganic antireflective coating is preferably a material selected from the group consisting of SiON, Ge, and SiC. In a preferred embodiment, the semiconductor substrate is a layer of polycrystalline or amorphous silicon, the sacrificial layer consists essentially of TiN, and the inorganic antireflective coating consists essentially of SiON.

In accordance with another aspect of the invention, a method of forming features of an integrated circuit (IC) is provided. In this method a sacrificial layer is formed over a semiconductor substrate, the layer being selectively removable from the substrate and compatible with photolithography. An inorganic antireflective coating is then formed over the sacrificial layer. Thereafter, a patterned layer of photoresist material is formed over the anitreflective coating. After the patterned layer of photoresist layer is formed, the portions of the antireflective coating, the sacrificial layer, and the semiconductor substrate which are not covered by the patterned layer of photoresist material are removed to define features of an IC. Finally, the sacrificial layer is removed from the features to lift the antireflective coating off the features of the IC.

The sacrificial layer is preferably removed by a wet etchant which is subjected to ultrasonic agitation. In a preferred embodiment, the wet etchant simultaneously attacks the patterned layer of photoresist material and the sacrificial layer. Alternatively, the patterned layer of photoresist material is first stripped from the antireflective coating and then the sacrificial layer is removed.

In accordance with a further aspect of the present invention, IC devices formed in accordance with the methods of the present invention are provided.

The present invention allows an inorganic BARC layer to be incorporated in the process flow for an IC, thereby enabling the patterning of small features, e.g., 0.25 μm and smaller, without causing significant damage to neighboring areas of the IC. Further, when the sacrificial layer of the present invention is formed of a material which can be removed by the wet etchants used in conventional resist stripping processes, lift-off of the BARC layer can be accomplished without requiring an additional step in the process flow.

These and other features and advantages of the present invention will become apparent upon reading the following detailed description and studying the various figures of the drawings.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE PREFERRED EMBODIMENTS

Figure 1A:
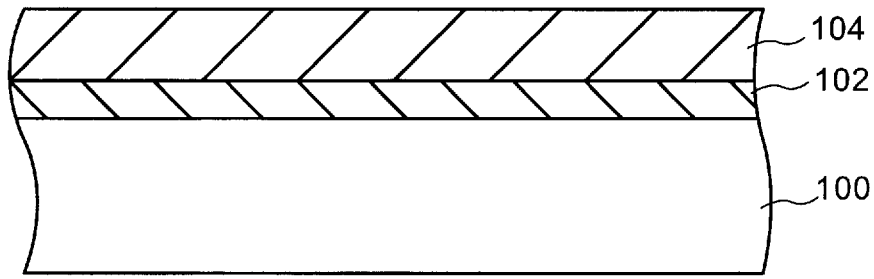
FIG. 1A is a cross sectional view of a silicon wafer with a gate oxide layer and a silicon layer formed thereon.

The methods of the invention will first be described with reference to FIGS. 1A–1G, which illustrate the formation of a gate electrode using a sacrificial layer. FIG. 1A shows silicon wafer 100 with gate oxide layer 102 and silicon layer 104 formed thereon. Those skilled in the art are familiar with techniques for forming layers 102 and 104. For example, gate oxide layer 102 may be formed by thermal oxidation of silicon wafer 100 to form silicon dioxide and silicon layer 104 may be formed by chemical vapor deposition. Silicon layer 104 may be either polycrystalline silicon or amorphous silicon depending upon the conditions, e.g., temperature, under which the layer is deposited.

In accordance with the invention, a sacrificial layer is formed on a semiconductor substrate, the sacrificial layer being selectively removable from the substrate and compatible with photolithography. As used in connection with the description of the invention, the phrase "selectively removable from the substrate" means that the sacrificial layer can be removed from the substrate, e.g., with a wet etchant, without causing significant loss of silicon or oxide on the wafer. To accomplish such selective removal, it is generally sufficient to use a sacrificial layer which can be etched with a wet etchant that etches the sacrificial layer substantially faster than the rate at which it etches silicon or oxide. The wet etchant preferably etches the sacrificial layer at a rate which is at least about eight times faster than the rate at which it etches silicon, e.g., amorphous or polycrystalline silicon, or oxide, e.g., field isolation. Further, as used in connection with the description of the invention, the phrase "compatible with photolithography" means that the photolithographical patterning of small features of an integrated circuit having small features can be accomplished with the sacrificial layer in place. In other words, the sacrificial layer does not substantially impair the optical properties, e.g., minimum reflectivity, of an inorganic bottom antireflective coating (BARC) formed on the sacrificial layer to enable the photolithographical patterning of small features, e.g., 0.25 $\mu$m and smaller.

Figure 1B:
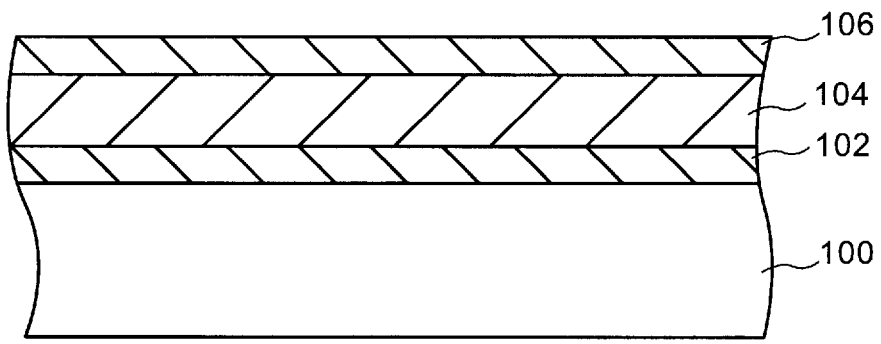
FIG. 1B shows the structure of FIG. 1A with a sacrificial layer of the present invention formed on the silicon layer.

FIG. 1B shows sacrificial layer 106 formed on silicon layer 104. Preferred materials for sacrificial layer 106 include, but are not limited to, TiN, tetraethyl orthosilicate-based (TEOS-based) silicon oxide grown by low pressure chemical vapor deposition (LPCVD) using TEOS as a source, spin-on-glass (SOG) such as, for example, hydrogen silsesquioxane and methyl silsesquioxane, and porous polymeric materials which can be readily dissolved in a solvent, e.g., benzocyclobutene (BCB) and poly(arylene ether) polymer. The sacrificial layer may be formed using known techniques appropriate for the particular material. By way of example, a sacrificial layer of TiN may be formed by sputter deposition, a sacrificial layer of SOG may be formed by spin-on coating, and a sacrificial layer of BCB may be formed by spin-on coating. The thickness of the sacrificial layer is selected to balance thorough removal of the BARC layer with the constraints of photolithography. More particularly, a thicker sacrificial layer facilitates removal of the BARC layer whereas a thinner sacrificial layer preserves the optical properties, e.g., minimum reflectivity, of the BARC layer which are needed for photolithographical patterning of small features. In general, these considerations are adequately balanced when the thickness of the sacrificial layer is within the range of from about 100 Å to about 2000 Å. The thickness of the sacrificial layer is preferably within the range of from about 200 Å to about 1000 Å, with thicknesses from about 200 Å to about 500 Å being most preferred.

Figure 1C:
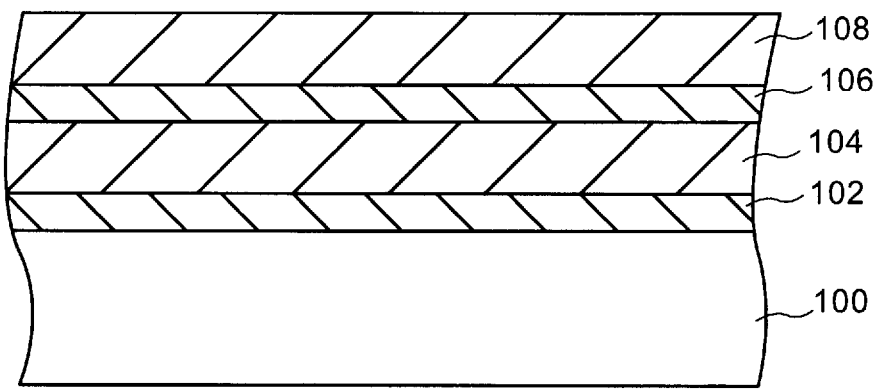
FIG. 1C shows the structure of FIG. 1B with an inorganic bottom antireflective coating (BARC) formed on the sacrificial layer of the present invention.

After the sacrificial layer is formed, an inorganic BARC layer is formed over the sacrificial layer. FIG. 1C shows inorganic BARC layer 108 formed on sacrificial layer 106. The BARC layer 108 is preferably formed of SiON, however, other materials such as, but not limited to, Ge and SiC also may be used. As used in connection with the description of the invention, the term "SiON" means silicon oxynitride materials having a composition $Si_xO_yN_z$, (and inevitable impurities), where x is about 0.4 to about 0.6, y is about zero to about 0.4, and z is about 0.1 to about 0.6. The BARC layer 108 may be formed in accordance with known techniques including, in the case of SiON, plasma enhanced chemical vapor deposition (PECVD). The thickness of the BARC layer may be within the range of from about 50 Å to about 5000 Å, with the preferred thickness being from about 50 Å to about 500 Å, and the most preferred thickness being from about 200 Å to about 300 Å.

Figure 1D:
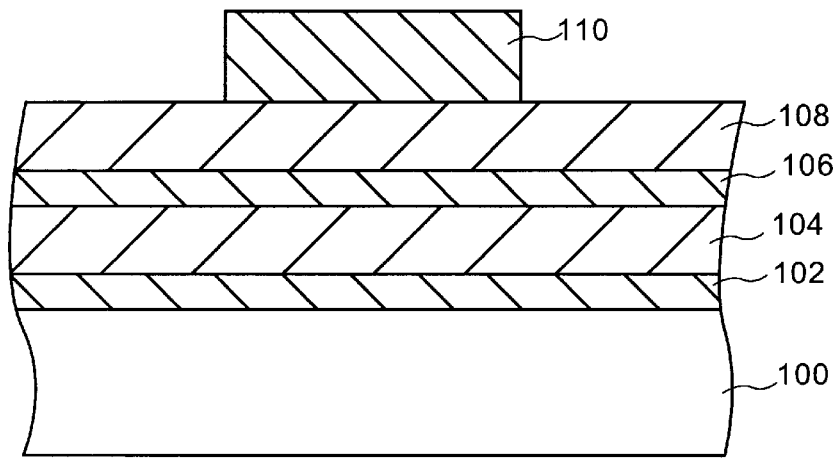
FIG. 1D shows the structure of FIG. 1C with a patterned layer of photoresist material formed on the BARC layer.
Figure 1E:
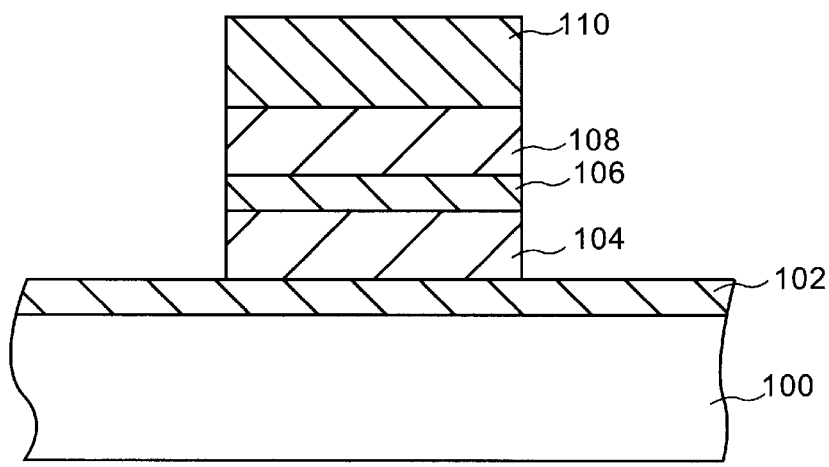
FIG. 1E shows the structure of FIG. 1D after etching to remove portions of the BARC layer, the sacrificial layer, and the silicon layer.

Next, a layer of photoresist material is formed on the BARC layer and patterned in accordance with known techniques. FIG. 1D shows photoresist material 110 on BARC layer 108 after patterning has been completed. The photoresist material 110 acts as an etch barrier which prevents the underlying material from being removed during subsequent etching in which the gate electrode is defined. FIG. 1E shows the structure of FIG. 1D after etching. As shown in FIG. 1E, the portions of the BARC layer 108, sacrificial layer 106, and silicon layer 104 which are not covered by photoresist material 110 are removed during etching. The etching may be accomplished using known techniques, e.g., plasma etching. Those skilled in the art will appreciate that BARC layer 108, sacrificial layer 106, and silicon layer 104 may be etched using either a "one shot" approach which removes these layers simultaneously or a series of dedicated etches which removes these layers one layer at a time.

In accordance with the invention, the sacrificial layer is then removed to lift off the BARC layer. In many standard process flow recipes, etching of silicon layer 104 is followed by a resist stripping process in which photoresist material 110 is removed. This resist stripping process is accomplished using known wet chemical solutions having sulfuric/peroxide, e.g., $H_2SO_4:H_2O=6:1\sim10:1$, and ammonia/peroxide, e.g., $NH_4OH:H_2O_2:H_2O=1:1:5$, chemistries. If the sacrificial layer is formed of a material which can be removed by such wet etchants, then the sacrificial layer can be removed simultaneously with the photoresist material. This is advantageous because it allows liftoff of the BARC layer to be accomplished without requiring an additional step in the process flow. A thin layer of TiN can be readily etched using wet chemical solutions such as $H_2SO_4:H_2O= 6:1\sim10:1$ at about 120° C. or peroxide alone at elevated temperatures, i.e., temperatures greater than or equal to 50° C. Accordingly, the sacrificial layer is preferably formed of TiN.

Figure 1F:
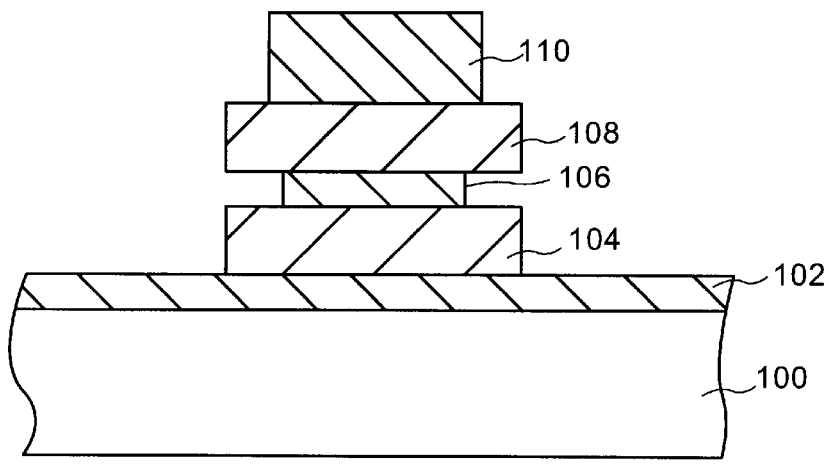
FIG. 1F shows the structure of FIG. 1E approximately midway through the simultaneous removal of the photoresist material and the sacrificial layer to lift off the BARC layer in accordance with a preferred embodiment of the present invention.
Figure 1G:
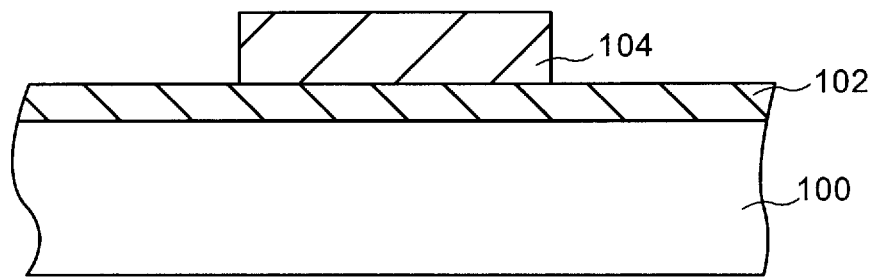
FIG. 1G is a cross sectional view of a silicon wafer with a gate oxide layer and a gate electrode formed thereon after removal of the sacrificial layer to lift off the BARC layer in accordance with the present invention.

FIG. 1F illustrates the simultaneous removal of the photoresist material and a sacrificial layer of TiN approximately midway through the removal process. As can be seen in FIG. 1F, the wet etchant simultaneously chemically attacks both sacrificial layer 106 and photoresist material 110. To ensure complete removal of BARC layer 108 without adherence, agitation, e.g., ultrasonic agitation, is preferably used during the wet etching process. Alternatively, the wet etching process may be carried out in a recirculating bath. When sacrificial layer 106 is completely etched away, BARC layer 108 lifts off wafer 100 and is carried away by the wet etchant. This leaves only silicon layer 104, which has been patterned to form a gate electrode, and gate oxide 102 on wafer 100, as shown in FIG. 1G.

Figure 2A:
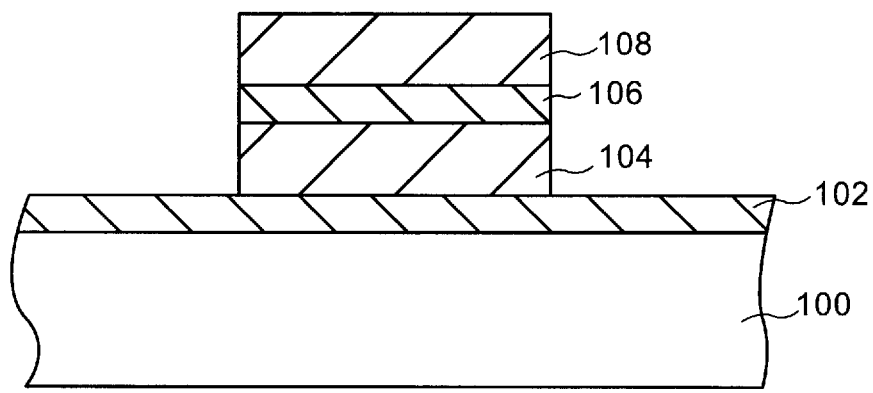
FIG. 2A shows the structure of FIG. 1E after the photoresist material has been removed in accordance with an alternative embodiment of the present invention.
Figure 2B:
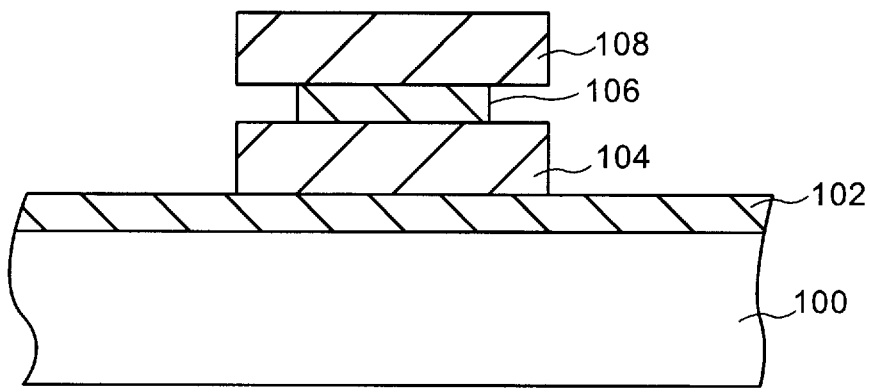
FIG. 2B shows the structure of FIG. 2A approximately midway through the removal of the sacrificial layer to lift off the BARC layer in accordance with an alternative embodiment of the present invention.

FIGS. 2A and 2B depict an alternative embodiment of the invention in which the photoresist material and the sacrificial layer are sequentially removed. This embodiment is useful when the sacrificial layer is formed of a material which is not readily removed by the above-described wet chemical solutions used in the resist stripping process, e.g., TEOS-based silicon oxide and SOG. Starting with the structure shown in FIG. 1E, photoresist material 110 is first stripped as shown in FIG. 2A. During the resist stripping process, sacrificial layer 106 remains substantially intact. Thereafter sacrificial layer 106 is etched away using an appropriate wet etchant. FIG. 2B illustrates the removal of sacrificial layer 106 approximately midway through the removal process. By way of example, when sacrificial layer 106 is formed of SOG, suitable wet etchants include, but are not limited to, wet etchants in which $HF:H_2O=1:50$.

Figure 3:
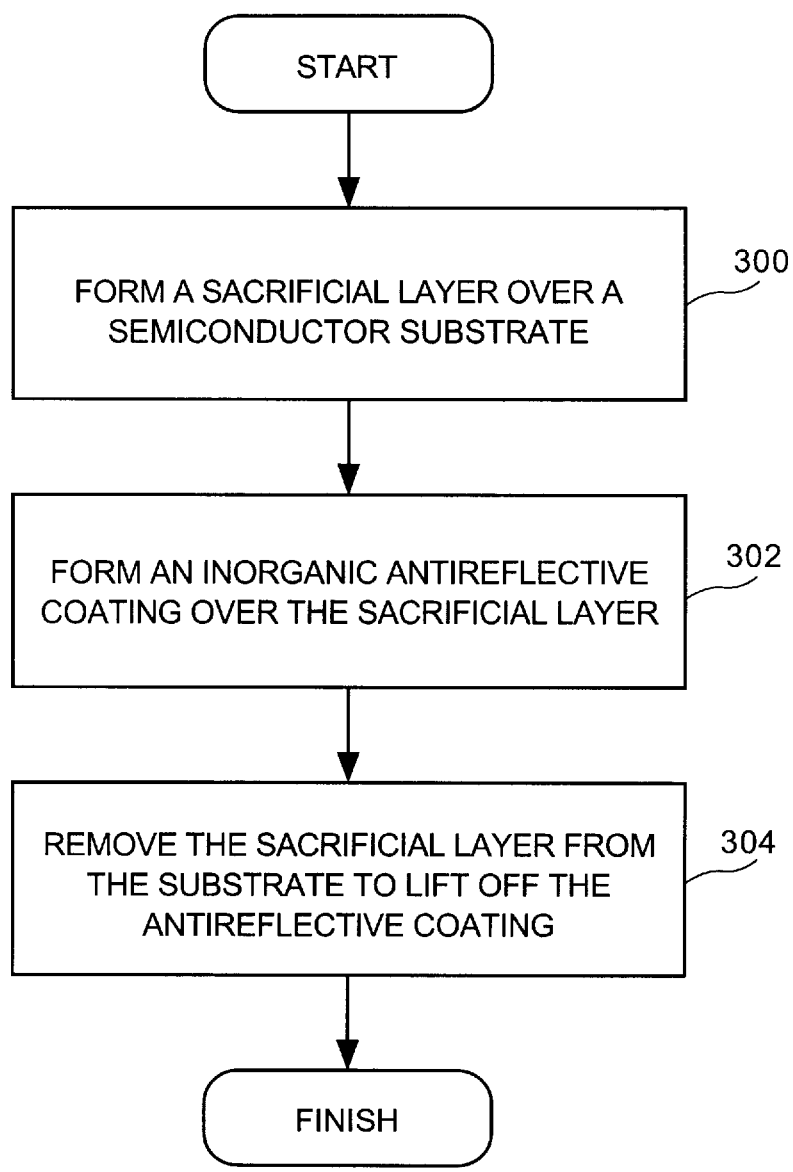
FIG. 3 is a flow diagram of the method of removing an inorganic antireflective coating of the present invention.

FIG. 3 is a flow diagram of the method of removing an inorganic antireflective coating from a semiconductor substrate of the invention. In step 300 a sacrificial layer is formed over a semiconductor substrate. In step 302 an inorganic antireflective coating is formed over the sacrificial layer. In step 304 the sacrificial layer is removed from the substrate to lift off the antireflective coating.

Figure 4:
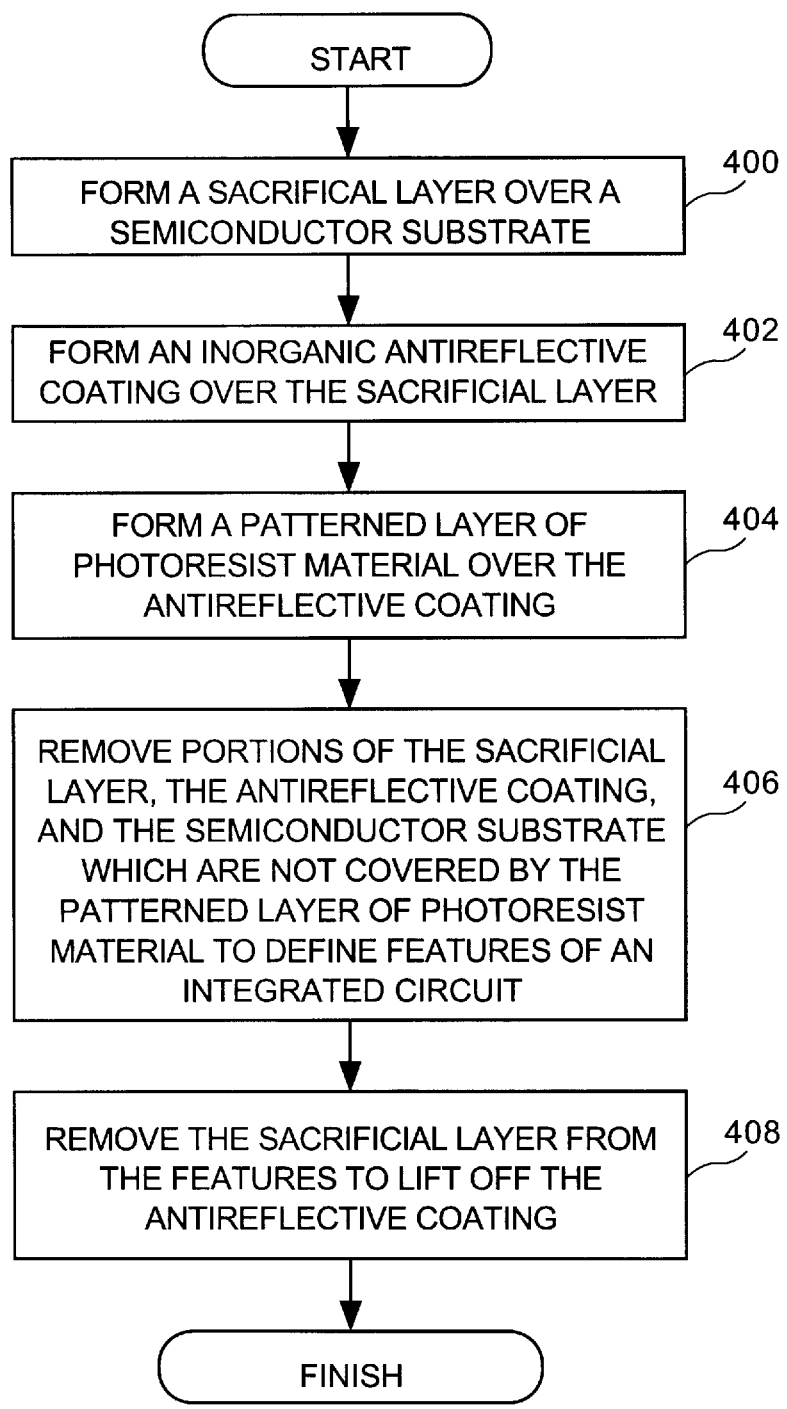
FIG. 4 is a flow diagram of the method of forming features of an integrated circuit of the present invention.

FIG. 4 is a flow diagram of the method of forming features of an integrated circuit of the invention. In step 400 a sacrificial layer is formed over a semiconductor substrate. In step 402 an inorganic antireflective coating is formed over the sacrificial layer. In step 404 a patterned layer of photoresist material is formed over the antireflective coating. In step 406 the portions of the sacrificial layer, the antireflective coating, and the semiconductor substrate which are not covered by the patterned layer of photoresist material are removed to define features of an integrated circuit. In step 408 the sacrificial layer is removed from the features to lift off the antireflective coating. In a preferred embodiment, the sacrificial layer is removed by a wet etchant which is subjected to ultrasonic agitation. The wet etchant preferably simultaneously attacks the patterned layer of photoresist material and the sacrificial layer. Alternatively, the patterned layer of photoresist material is first stripped from the antireflective coating and then the sacrificial layer is removed to lift off the antireflective coating.

EXAMPLE

The present invention will now be described in terms of a specific example. It should be borne in mind that this example is merely illustrative of a particular application of the inventive method and should in no way be construed to limit the usefulness of the invention in other applications.

Four layers were formed over a silicon wafer. First, a gate oxide layer having a thickness of about 50 Å was formed on a silicon wafer by thermal oxidation. Second, a layer of polycrystalline silicon having a thickness of about 2,500 Å was formed on the gate oxide layer by chemical vapor deposition. Third, a layer of TiN having a thickness of about 150 Å was formed on the silicon layer by sputter deposition. Fourth, a layer of $Si_xO_yN_z$, where $x\approx0.5$, $y\approx0.3$, and $z\approx0.12$, having a thickness of about 250 Å was formed on the TiN layer by PECVD. The wafer was then subjected to photolithography to pattern polycrystalline silicon lines having a line width of 0.25 μm. After etching to define such lines, the remaining sacrificial layer and patterned layer of photoresist material were removed simultaneously in a bath of sulfuric/peroxide solution containing $H_2SO_4:H_2O\approx6:1$ at about 120° C. During removal, the bath was subjected to ultrasonic agitation. Upon analysis, it was observed that the BARC layer was thoroughly removed from the polycrystalline lines and that such lines had a clean silicon surface with an acceptable line width. Accordingly, it was concluded that the use of a TiN sacrificial layer is compatible with photolithography.

While this invention has been described in terms of several preferred embodiments, there are alterations, permutations, and equivalents which fall within the scope of this invention. It should also be noted that there are many ways of implementing the methods and devices of the present invention. It is therefore intended that the following claims be interpreted as including all such alterations, permutations, and equivalents as fall within the true spirit and scope of the present invention.

What is claimed is:

1. A method of removing an inorganic antireflective coating from a semiconductor substrate, comprising:

forming a sacrificial layer over a semiconductor substrate, said layer being selectively removable from said substrate and compatible with photolithography;

forming an inorganic antireflective coating over said sacrificial layer; and removing said sacrificial layer from said substrate, wherein removal of said sacrificial layer lifts said coating off said substrate.

2. The method of claim 1, wherein the sacrificial layer is comprised of a material selected from the group consisting of TiN, tetraethyl orthosilicate-based silicon oxide, spin-on glass, and porous polymeric materials.

3. The method of claim 1, wherein the sacrificial layer consists essentially of TiN.

4. The method of claim 1, wherein the spin-on glass is comprised of hydrogen silsesquioxane or methyl silsesquioxane.

5. The method of claim 2, wherein the antireflective layer is comprised of a material selected from the group consisting of SiON, Ge, and SiC.

6. The method of claim 5, wherein the semiconductor substrate is a layer of polycrystalline or amorphous silicon, the sacrificial layer consists essentially of TiN, and the antireflective coating consists essentially of SiON.

7. The method of claim 1, wherein the method is used to manufacture an integrated circuit.

8. A method of forming features of an integrated circuit, comprising:

forming a sacrificial layer over a semiconductor substrate, said layer being selectively removable from said substrate and having properties compatible with photolithography;

forming an inorganic anitreflective coating over said sacrificial layer;

forming a patterned layer of photoresist material over said anitreflective coating;

removing portions of said coating, said sacrificial layer, and said semiconductor substrate which are not covered by said patterned layer of photoresist material to define features of an integrated circuit; and removing said sacrificial layer from said features, wherein removal of said sacrificial layer lifts said coating off said features.

9. The method of claim 8, wherein the sacrificial layer is removed by a wet etchant which is subjected to ultrasonic agitation.

10. The method of claim 9, wherein the wet etchant simultaneously attacks the patterned layer of photoresist material and the sacrificial layer.

11. The method of claim 8, wherein, before the sacrificial layer is removed, the patterned layer of photoresist material is stripped from the antireflective coating.

12. The method of claim 8, wherein the sacrificial layer is comprised of a material selected from the group consisting of TiN, tetraethyl orthosilicate-based silicon oxide, spin-on-glass, and porous polymeric materials.

13. The method of claim 8, wherein the antireflective coating is comprised of a material selected from the group consisting of SiON, Ge, and SiC.

14. The method of claim 8, wherein the semiconductor substrate is a layer of polycrystalline or amorphous silicon, the sacrificial layer consists essentially of TiN, and the antireflective coating consists essentially of SiON.

15. The method of claim 8, wherein the method is used to manufacture an integrated circuit.

16. A method of removing an inorganic antireflective coating from a semiconductor substrate, comprising:

forming a sacrificial layer comprised of TiN over a semiconductor substrate;

forming an inorganic antireflective coating over said sacrificial layer; and removing said sacrificial layer from said substrate, wherein removal of said sacrificial layer lifts said coating off said substrate.

17. The method of claim 16, wherein the semiconductor substrate is a layer of polycrystalline or amorphous silicon.

18. The method of claim 17, wherein the antireflective coating is comprised of a material selected from the group consisting of SiON, Ge, and SiC.

19. The method of claim 18, wherein the sacrificial layer consists essentially of TiN.

20. The method of claim 19, wherein the antireflective coating consists essentially of SiON.

21. The method of claim 20, wherein the method is used to manufacture an integrated circuit.

* * * * *